United States Patent
Taler et al.

(10) Patent No.: US 7,330,517 B2
(45) Date of Patent: Feb. 12, 2008

(54) AMPLIFIER LINEARIZATION USING NON-LINEAR PREDISTORTION

(75) Inventors: Ilan Taler, Gan (IL); Dan Wolberg, Tel Aviv (IL); Ran Sharon, Mevaseret-Tzion (IL)

(73) Assignee: P-Wave Ltd., Tel Aviv (IL)

( * ) Notice: Subject to any disclaimer, the term of this patent is extended or adjusted under 35 U.S.C. 154(b) by 708 days.

(21) Appl. No.: 10/718,688

(22) Filed: Nov. 24, 2003

(65) Prior Publication Data

US 2005/0111575 A1 May 26, 2005

(51) Int. Cl.
*H04L 25/49* (2006.01)
(52) U.S. Cl. .................................................. 375/297
(58) Field of Classification Search ................ 375/297, 375/296, 295; 455/39, 500, 507, 517, 522, 455/91, 114.2, 114.3, 127.1, 127.2, 127.5; 330/124 R, 127, 199, 200; 340/500, 693.1, 340/825, 7.36, 7.37, 7.2, 825.36; 370/310
See application file for complete search history.

(56) References Cited

U.S. PATENT DOCUMENTS

| | | | |
|---|---|---|---|
| 6,501,805 B1 | 12/2002 | Twitchell | |
| 6,549,067 B1 | 4/2003 | Kenington | |
| 2002/0193087 A1 | 12/2002 | Kim | |
| 2004/0160273 A1 | 8/2004 | Cavers et al. | 330/149 |
| 2004/0161053 A1 | 8/2004 | Cavers et al. | 375/297 |
| 2005/0078767 A1 | 4/2005 | Liu | 375/297 |
| 2005/0099230 A1 | 5/2005 | Shanbhag | 330/149 |

FOREIGN PATENT DOCUMENTS

EP     1 193 866     4/2002

*Primary Examiner*—Pankaj Kumar
(74) *Attorney, Agent, or Firm*—Myers Dawes Andras & Sherman LLP

(57) ABSTRACT

Apparatus for amplifying an input signal having an input signal power includes a power amplifier, which is adapted to amplify an intermediate signal so as to generate an output signal, and which is characterized by a non-linearity. A non-linear filter is coupled to decompose the input signal into a series of input signal components, each such component proportional to a product of the input signal by a respective integer power of the input signal power, and is adapted to filter the signal components responsively to the non-linearity so as to generate the intermediate signal for input to the power amplifier.

32 Claims, 4 Drawing Sheets

AMPLIFIER LINEARIZATION USING NON-LINEAR PREDISTORTION

FIELD OF THE INVENTION

The present invention relates generally to high-performance amplifiers for communications applications, and specifically to correction of amplifier non-linearities using predistortion.

BACKGROUND OF THE INVENTION

Modern mobile communication systems use multiple channels, closely spaced over an assigned frequency band. In order to avoid intermodulation products and spectral regrowth, both in and out of band, it is essential that radio frequency (RF) power amplifier circuits used in these systems be highly linear. A high level of linearity is also required in single-channel transmitters which transmit a wideband, variable-envelope signal, such as a CDMA signal.

A major source of non-linearity is distortion, which occurs due to non-linear amplitude and phase response of the amplifier, particularly as power nears the saturation level. Third-order distortion non-linearities typically give the strongest intermodulation products, but higher-order products can be significant. One method of correcting for amplifier distortion, and thus improving linearity, is predistortion, in which a controlled, non-linear distortion is applied to the amplifier input signals. Predistortion circuitry is designed to give non-linear amplitude and phase characteristics complementary to the distortion generated by the amplifier itself, so that ideally, the distortion is canceled in the amplifier output over the entire signal bandwidth. A feedback connection is generally provided from the amplifier output to the predistortion circuitry, for use in adjusting predistortion coefficients for optimal linearization.

Various schemes have been proposed for digital-domain predistortion of RF power amplifier input signals. For example, U.S. Pat. No. 6,141,390, whose disclosure is incorporated herein by reference, describes a system that uses a straight inverse modeling scheme with orthogonal predictor variables to determine the inverse of the distortion caused by a power amplifier of a RF transmitter. The predistorter system determines complex predistorter coefficients based on the inverse modeling scheme, and stores the coefficients in a look-up table (LUT). The coefficients from the LUT are then used as the tap weights of a non-linear digital filter implementing the predistorter.

Another digital predistortion system is described in U.S. Pat. Nos. 6,549,067 and 6,580,320, whose disclosures are also incorporated herein by reference. A predistortion circuit samples the input to a non-linear amplifier, and multiplies the input by itself using mixers in order to generate various orders of distortion. Filters/time delay means are incorporated into the paths that generate the orders of distortion in order to produce phase and/or amplitude variation with frequency. The distortion orders are summed to provide the predistortion. The filter/time delay means can be implemented by adaptive filters in digital signal processing (DSP) circuits, which sample the output of the amplifier being linearized in order to obtain feedback for adapting the filter(s). The in-phase and quadrature parts of the input are separately digitally predistorted.

SUMMARY OF THE INVENTION

Embodiments of the present invention provide an improved digital predistortion circuit, which operates on the input signal to a non-linear power amplifier in order to linearize the amplifier output and in addition performs linear equalization. The predistortion circuit comprises a non-linear filter, which includes a power expander for decomposing the input baseband signal, X, into a series of signal components. Each of the components is proportional to a product of the input signal by an integer power of the input signal power envelope $|X|^2$. These signal components are filtered, using filter coefficients that are adaptively determined in response to the non-linearity of the power amplifier. The filtered signal components are then combined to provide an intermediate, predistorted signal for input to the power amplifier. This decomposition of signal non-linearity in terms of the input signal power gives a faithful model of the non-linear characteristics of the power amplifier and allows the non-linearity to be corrected by the predistortion circuit with low computational complexity, relative to methods known in the art.

In some embodiments of the present invention, the filter coefficients are determined by an adaptation circuit, which operates by inverse modeling of the power amplifier non-linearity. The output of the power amplifier is sampled and decomposed by a power expander in the adaptation circuit, as in the non-linear filter. The components of the sampled output signal are then filtered by the adaptation circuit in a similar manner to the filtering applied by the non-linear filter to the input signal. The filter coefficients in the adaptation circuit are adjusted by an adaptive process until the filter output matches the intermediate signal that is generated by the non-linear filter (as input to the power amplifier). These adapted filter coefficients, representing the inverse of the amplifier non-linearity, are then applied by the non-linear filter in order to provide the appropriate predistortion to the intermediate signal.

In some embodiments of the present invention, the non-linear filter also comprises a weighted linear combiner, which generates signal elements having minimal cross-correlation over a given period, as linear combinations of the signal components produced by the power expander. Each of the substantially uncorrelated signal elements is filtered, typically using the filter coefficients determined by the adaptation circuit, which comprises a similar weighted linear combiner. Treatment of the signal elements in this manner is useful in easing the operation of the adaptation technique and attaining faster convergence of the filter coefficients used in the non-linear filter. The adaptation circuit may also be used to adaptively determine weighting coefficients, for use by the linear combiner in generating the signal elements, as well as in selecting the orders (i.e., the integer powers) of the signal components to be generated by the power expander.

There is therefore provided, in accordance with an embodiment of the present invention, apparatus for amplifying an input signal having an input signal power, including:

a power amplifier, which is adapted to amplify an intermediate signal so as to generate an output signal, and which is characterized by a non-linearity; and a non-linear filter, which is coupled to decompose the input signal into a series of input signal components, each such component proportional to a product of the input signal by a respective integer power of the input signal power, and which is adapted to filter the signal components responsively to the non-linearity so as to generate the intermediate signal for input to the power amplifier.

In a disclosed embodiment, the non-linear filter is adapted to combine the input signal components so as to generate substantially uncorrelated input signal elements, and to filter each of the substantially uncorrelated input signal elements so as to compensate for the non-linearity. Typically, the non-linear filter is adapted to generate the substantially uncorrelated input signal elements by linear combination of the input signal components, using weighting coefficients determined so as to minimize a correlation between the signal elements, and to sum the filtered substantially uncorrelated input signal elements in order to generate the intermediate signal.

Additionally or alternatively, the apparatus includes an adaptation circuit, which is arranged to decompose the output signal so as to generate substantially uncorrelated output signal components, and to process the substantially uncorrelated output signal components in order to determine filter coefficients to be applied by the non-linear filter in filtering the substantially uncorrelated input signal elements. Typically, the adaptation circuit is arranged to filter the substantially uncorrelated output signal components, and to compare the filtered substantially uncorrelated output signal components to the intermediate signal in order to determine the filter coefficients to be applied by the non-linear filter to each of the substantially uncorrelated input signal components. For this purpose, the adaptation circuit may be arranged to compute successive differences between the intermediate signal and the filtered substantially uncorrelated output signal components, in order to determine a respective error signal for use in adaptively computing the filter coefficients to be applied to each of the substantially uncorrelated input signal components. Additionally or alternatively, the non-linear filter is adapted to generate the substantially uncorrelated input signal elements by linear combination of the input signal components, and the adaptation circuit is arranged to adaptively determine weighting coefficients to be applied by the non-linear filter in generating the substantially uncorrelated input signal elements and to be applied by the adaptation circuit in generating the substantially uncorrelated output signal elements.

In further embodiments, the adaptation circuit is coupled to receive and process samples of the output signal so as to produce an inverse model of the non-linearity of the power amplifier, and to determine filter coefficients to be applied by the non-linear filter to the signal components responsively to the inverse model. Typically, the adaptation circuit is arranged to filter the samples of the output signal responsively to the inverse model, and is further coupled to compare the intermediate signal to the filtered samples of the output signal in order to determine the filter coefficients. In one embodiment, the adaptation circuit is arranged to determine the filter coefficients adaptively using a least mean square (LMS) adaptation process, so as to minimize an error signal based on a comparison of the intermediate signal to the filtered samples of the output signal. Additionally or alternatively, the adaptation circuit is further arranged to determine adaptively the input signal components into which the input signal is to be decomposed for filtering by the non-linear filter.

In some embodiments, the apparatus includes a sampling channel, which couples the output of the power amplifier to the adaptation circuit, wherein the adaptation circuit includes a channel compensator, which is adjustable so as to compensate for distortion introduced in the samples of the output signal by the sampling channel. In one embodiment, the apparatus includes a calibrator circuit, which is adapted to inject a calibration signal into the sampling channel, so as to determine the distortion introduced in the samples, for use in adjusting the channel compensator. Typically, the calibrator circuit includes a digital logic driver, which generates a square wave of known amplitude and frequency, and a bandpass filter, which filters the square wave so as to provide the calibration signal.

Typically, the input signal and the intermediate signal are baseband signals, and the apparatus includes an upconverter for upconverting the intermediate signal to a radio frequency (RF) for input to the power amplifier, and wherein the non-linear filter is adapted to apply a low-pass filtering function to the signal components.

There is also provided, in accordance with an embodiment of the present invention, a method for amplifying an input signal having an input signal power, using a power amplifier characterized by a non-linearity, the method including:
  decomposing the input signal into a series of input signal components, each such component proportional to a product of the input signal by a respective integer power of the input signal power;
  filtering the signal components responsively to the non-linearity so as to generate an intermediate signal for input to the power amplifier; and
  amplifying the intermediate signal using the power amplifier.

There is additionally provided, in accordance with an embodiment of the present invention, a receiver, including:
  a sampling channel, which is adapted to receive and digitize an analog input signal, so as to generate a sequence of digital samples of the input signal;
  a calibration circuit, which includes:
    a digital logic device, which is adapted to generate a square wave of known amplitude and frequency; and
    a bandpass filter, which is coupled to filter the square wave so as to provide a calibration signal for input to the sampling channel, for use in measuring a distortion introduced by the sampling channel; and
  a channel compensator, which is coupled to operate on the digital samples so as to compensate for the distortion measured using the calibration circuit.

Typically, the digital logic device comprises a temperature-compensated emitter-coupled logic (ECL) device, and the bandpass filter comprises a printed circuit filter. In a disclosed embodiment, the calibration circuit includes a frequency synthesizer, which is adapted to generate a spectrum of one or more frequency tones for input to the digital logic device, so as to cause the digital logic device to generate the square wave at the known frequency.

The present invention will be more fully understood from the following detailed description of the embodiments thereof, taken together with the drawings in which:

DETAILED DESCRIPTION OF EMBODIMENTS

Figure 1:
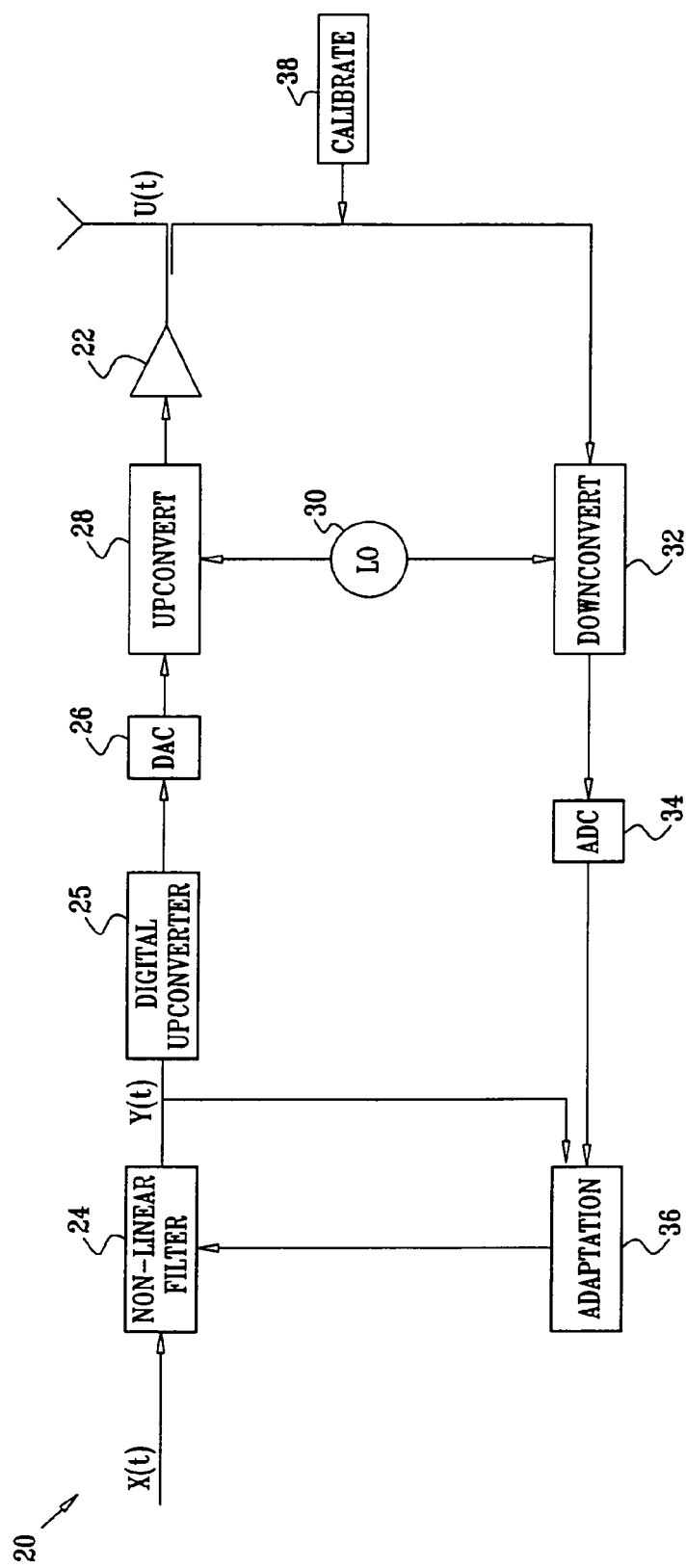
FIG. 1 is a block diagram that schematically illustrates apparatus for RF power amplification, in accordance with an embodiment of the present invention.

FIG. 1 is a block diagram that schematically illustrates apparatus 20 for power amplification of an input signal X(t), in accordance with an embodiment of the present invention. Apparatus 20 is built around a RF power amplifier 22, which generates a RF output signal U(t). Generally speaking, the input signal X(t) is band-limited and has a limited, known envelope peak-to-average ratio (EPAR). Typically, X(t) is a digital baseband signal, but the input signal to apparatus 20 may alternatively be an intermediate-frequency (IF) signal. Although certain linearization techniques applied in apparatus 20 are described hereinbelow with reference to baseband signal processing, these techniques may also be applied, mutatis mutandis, to IF signals, as will be apparent to those skilled in the art. Similarly, although amplifier 22 is assumed in this embodiment to generate RF output signals for transmission over the air (in a cellular communication network, for example), the principles of the present invention may likewise be applied to linearization of other types of amplifiers, as well as of other types of non-linear circuit elements.

Amplifier 22 is characterized by a certain non-linearity, which is typically not known precisely in advance and may change over time. To correct for this non-linearity, a non-linear filter 24 predistorts the input signal X(t), using a non-linear filtering function that is approximately the inverse of the amplifier non-linearity. Filter 24 outputs an intermediate, predistorted signal Y(t). This signal is typically upconverted to a real IF signal by a digital upconverter 25, which is then converted to analog form by a digital/analog converter (DAC) 26. The analog IF signal is then upconverted to the appropriate RF range by an upconverter 28, driven by a local oscillator 30 operating at the appropriate carrier frequency. (Alternatively, the I and Q components of the complex baseband signal may be converted to analog form prior to upconversion. In this case, carrier leakage and I/Q mismatch of the analog circuits are preferably calibrated and corrected for by appropriate digital processing of the baseband signal prior to D/A conversion.) The RF signal is amplified by amplifier 22 to generate the output signal U(t), which is then typically transmitted over the air.

A portion of the output of amplifier 22 is tapped off and downconverted by a downconverter 32, which typically operates at a known frequency offset relative to the frequency of upconverter 28, in order to facilitate the use of a real frequency scheme. In this case, a single analog/digital converter (ADC) 34 may be used to sample and digitize the downconverted output signal. The digitized samples are input to an adaptation circuit 36, which compares the sampled output signal to the intermediate signal Y(t) in order to estimate the distortion engendered by amplifier 22 (including distortion caused by DAC 26 and upconverter 28). In the embodiment described below, adaptation circuit 36 creates an inverse model of this distortion, in order to determine filter coefficients that will transform the output U(t) into the intermediate signal Y(t). These filter coefficients are then applied by non-linear filter 24 to predistort the input signal X(t). A calibrator 38 is used to calibrate the response of the sampling channel leading to the adaptation circuit, as described further hereinbelow.

Figure 2:
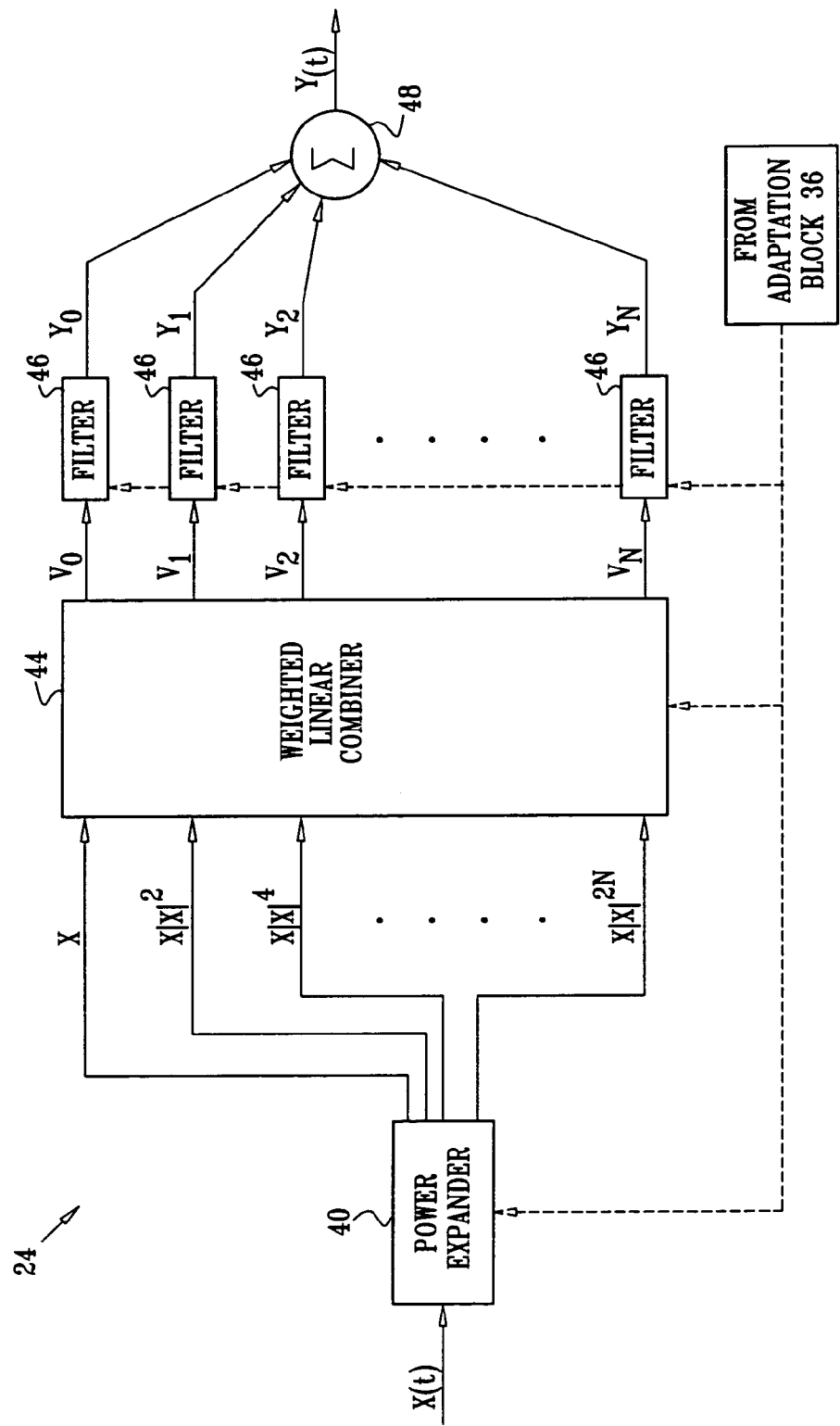
FIG. 2 is a block diagram that schematically illustrates a non-linear filter, in accordance with an embodiment of the present invention.

FIG. 2 is a block diagram that schematically shows details of non-linear filter 24, in accordance with an embodiment of the present invention. A power expander 40 generates power components of input signal X(t), by mixing the input signal with a series of integer powers of the input signal power envelope, $|X|^2$. Details of this power expander are shown below in FIG. 3. The power expansion is used to model an inverse of the non-linearity of amplifier 22. Alternatively, other types of expansions, as are known in the art, may be used in place of the power expansion X, $X|X|^2$, $X|X|^4$, ..., $X|X|^{2N}$ in order to model the amplifier non-linearity. For example, expander 40 may perform a Volterra expansion of the input signal.

The power components X, $X|X|^2$, $X|X|^4$, ..., $X|X|^{2N}$ generated by expander 40 are input to an weighted linear combiner 44, also referred to as a decorrelator, which generates signal elements $V_0$, $V_1$, $V_2$, ..., $V_N$ as a linear combination of the power components:

$$V_i = \sum_{j=0}^{i-1} a_{ij} X_j \tag{1}$$

Typically, the weighting coefficients $a_{ij}$ are chosen so as to minimize the cross-correlation between the different signal elements $V_i$ over a certain number of samples N+M of the input signal X(t). This correlation condition may be expressed in terms of requiring $a_{ij}$ to satisfy (for stationary signals) the following condition for all i and for j=0, 1, ..., i-1:

$$a_{ij} = \arg\min\left\{\sum_{k=-N}^{M} w_{i(k+N)} |r_{v_i,v_j}(k, a_{ij})|\right\} \tag{2}$$

Here $r_{V_i,V_j}(k,a_{ij})$ is the cross-correlation of $V_i$ with $V_j$ at a relative lag k, and $W_{i(k+N)}$ is a weighting function, which is chosen empirically. This criterion gives signal elements $V_0$, $V_1$, $V_2$, ..., $V_N$ that are substantially uncorrelated, in the sense that the mutual influence of the different signal elements in the non-linearity of amplifier 22 is minimized.

Alternatively or additionally, power expander 40 and linear combiner 44 may apply other signal correlation functions and criteria, as are known in the art. For example, the signal power components may be combined using Hermite polynomials, or Laguerre functions may be used in place of the power expander and linear combiner.

The coefficients $a_{ij}$ are determined by solving equation (2) using adaptation circuit 36. The coefficients determined by circuit 36 are then loaded into linear combiner 44, as well as being used in adaptation circuit 36, as described below. Periodically, the adaptation circuit may adaptively recompute and update the coefficients.

The signal elements $V_0$, $V_1$, $V_2$, ..., $V_N$ are filtered by respective adaptive filters 46 in order to generate predistorted signal elements $Y_0$, $Y_1$, $Y_2$, ..., $Y_N$. Filters 46 typically comprise FIR filters, whose filter coefficients are determined by adaptation circuit 36, as described below. Although combiner 44 and filters 46 are shown, for the sake of conceptual clarity, as separate functional elements in FIG. 2, in practice filters 46 may be configured to perform the function of combiner 44, as well. The predistorted signal elements $Y_0, Y_1, Y_2, \ldots, Y_N$ are then summed by an adder 48 to give the predistorted intermediate signal Y(t).

Typically, in order to process the input signal X(t) with sufficient speed, non-linear filter 24 comprises dedicated, hardware-based signal processing elements. For example, filter 24 may be implemented using one or more custom or semi-custom gate arrays and/or programmable digital signal processor chips and/or a dedicated ASIC. On the other hand, the adaptation process carried out by adaptation circuit 36 may proceed off-line, as described below, at substantially lower speeds. Therefore, the functions of adaptation circuit 36 may be implemented in software on a microprocessor. Other hardware and software implementations of the elements of apparatus 20 will be apparent to those skilled in the art and are considered to be within the scope of the present invention.

Figure 3:
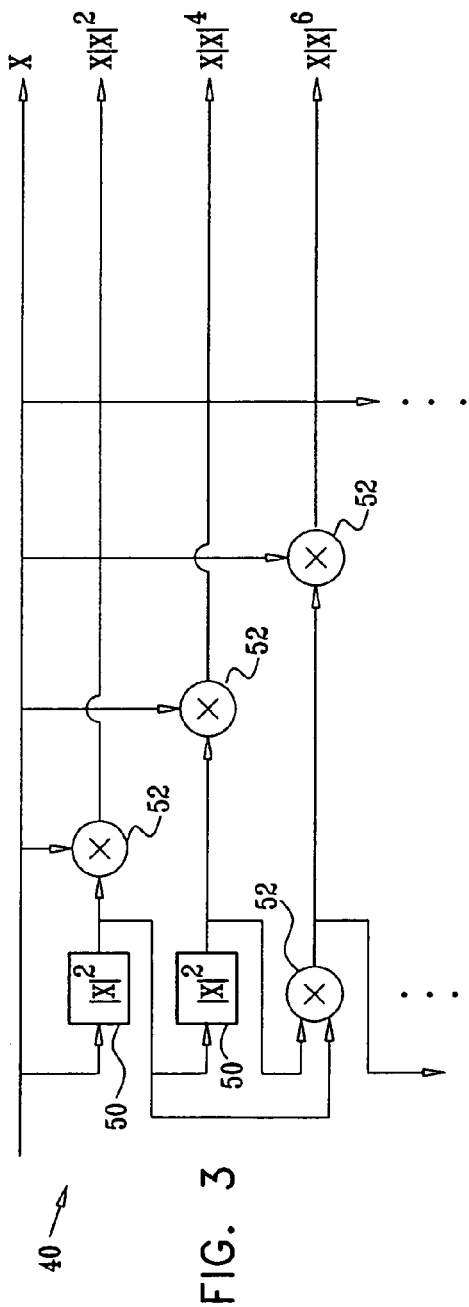
FIG. 3 is a block diagram that schematically illustrates a power expander, in accordance with an embodiment of the present invention.

FIG. 3 is a block diagram that schematically shows details of power expander 40, for operation on the baseband signal X, in accordance with an embodiment of the present invention. This design of the power expander is based on modeling the narrowband RF input signal to amplifier 22 as $x(t)=A(t)\cos(\omega t+\phi(t))$. This signal can be represented as the upconversion of the complex baseband signal $X(t)=A(t)\cdot\exp(j\phi(t))$:

$$x(t) = \operatorname{Re}\{A(t)\cdot\exp(j(\omega t + \varphi(t)))\} \quad (3)$$
$$= \operatorname{Re}\{A(t)\cdot\exp(j\omega t)\cdot\exp(j\varphi(t))\}$$
$$= \operatorname{Re}\{X(t)\cdot\exp(j\omega t)\}$$

Assuming amplifier 22 to be band-limited, the amplifier rejects signals at frequency $2\omega_0$ and higher, so that only the first harmonic zone is of interest. The first harmonic zone is affected only by odd-order intermodulations. Therefore, for any odd n, $$x^n(t) = A^n(t)\cos^n(\omega t + \varphi(t)) \stackrel{bpf}{\propto} A^n(t)\cos(\omega t + \varphi(t)) \quad (4)$$
$$= A^{n-1}(t)x(t)$$
$$= \operatorname{Re}\{|X(t)|^{n-1} X(t)\cdot\exp(j\omega t)\}$$

The output signal from the amplifier U(t) can thus be modeled in terms of a power expansion in $|X(t)|^{n-1}X(t)$.

This model of the amplifier non-linearity is reflected in the structure of power expander 40 shown in FIG. 3. The input signal X(t) is passed to a power computation circuit 50, which multiplies the signal by its complex conjugate to give the power envelope $|X|^2$. The input signal is then mixed with the power envelope by a mixer (or multiplier) 52, to give the third-order power component $X|X|^2$. Similar steps of multiplication and mixing proceed to generate the higher-order power components, as shown in the figure. The number of power orders to compute may be determined adaptively by adaptation circuit 36, based on actual decomposition of the sampled output signal U(t).

Figure 4:
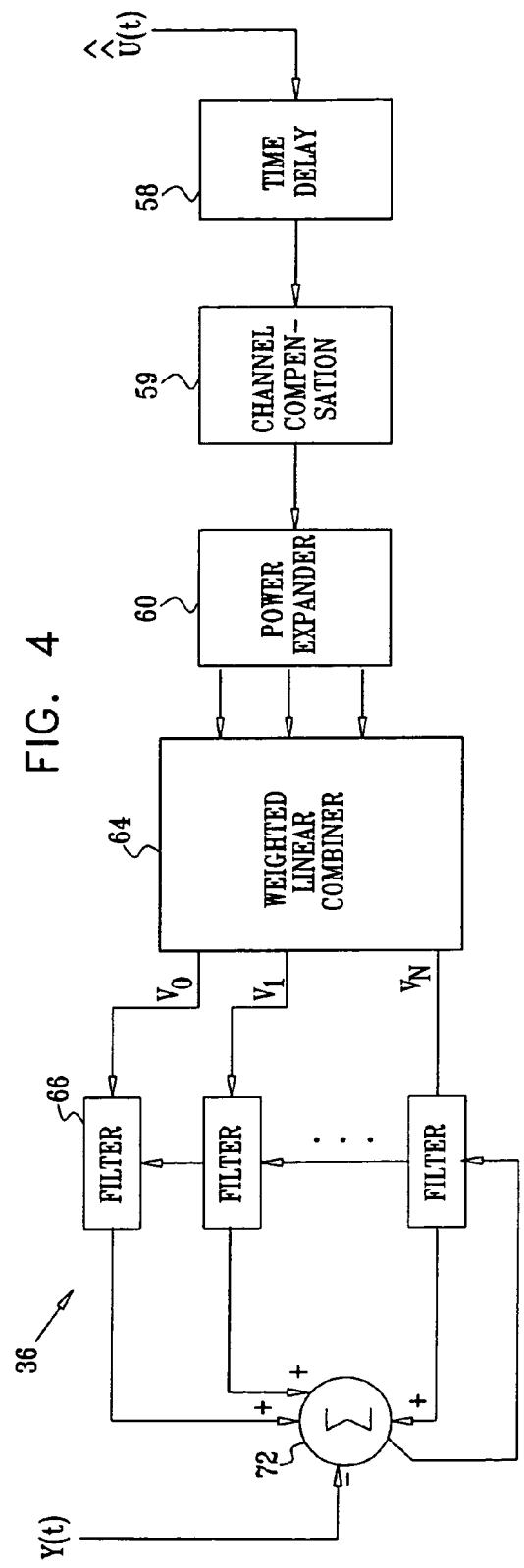
FIG. 4 is a block diagram that schematically illustrates an adaptation circuit, in accordance with an embodiment of the present invention.

FIG. 4 is a block diagram that schematically shows details of adaptation circuit 36, in accordance with an embodiment of the present invention. The sampled, downconverted signals received by circuit 36 from the output of amplifier 22 are delayed by a variable delay line 58, which is set so as to reduce the length of adaptive filters 66 that are used to process the signals subsequently, as described below. The signals are then filtered by a channel compensator 59, which compensates for any linear amplitude distortion that is introduced into output signals U(t) by the sampling channel through which the adaptation circuit receives the output samples. This sampling channel typically comprises downconverter 32 and ADC 34, and may comprise other components, as well. The distortion of the sampling channel may be measured by injecting a known calibration signal at the output of amplifier 22 prior to beginning operation of the amplifier, using calibrator 38, and measuring the sampled input to the adaptation circuit in response to the known calibration signal. This measurement is then used to calibrate compensator 59.

The sampled, compensated output signals are next separated into power components by a power expander 60, and are then processed by a weighted linear combiner 64 to yield a set of signal elements $V_0, V_1, V_2, \ldots, V_N$ with minimal cross-correlation. These operations are substantially similar to those carried out by expander 40 and linear combiner 44 in non-linear filter 24, as described above. Note, however, that in adaptation circuit 36, the signal elements $V_0, V_1, V_2, \ldots, V_N$ represent the output signal U(t), rather than the input signal X(t).

Each of the signal elements $V_0, V_1, V_2, \ldots, V_N$ is processed by a respective adaptive filter 66, which is typically implemented as a FIR filter with an adaptation controller, as is known in the art. An adder 72 sums the filtered signal elements, and subtracts the intermediate signal Y(t) from the sum to generate an error signal input to filters 66. Alternatively, each element $Y_0, Y_1, Y_2, \ldots, Y_N$ may be subtracted from the output of the corresponding filter 66 to generate a respective error signal. Any suitable adaptation algorithm, such as LMS adaptation, may be applied in generating the coefficients of filters 66. The adaptation creates an overall, combined filter response that is the inverse of the non-linear response of amplifier 22. De-correlation of signal elements $V_0, V_1, V_2, \ldots, V_N$ by linear combiner 64 is useful in filter adaptation, as it effectively decouples the process of convergence of the individual filters 66. As a result, the adaptation process is computationally simpler and generally converges more quickly. In order to perform adaptation in circuit 36 on narrowband signals, artificial constraints may be added to the signals that are received from the amplifier output.

When the coefficients of filters 66 have converged, adaptation circuit 36 transfers the coefficient values to non-linear filter 24 for application in filters 46. Adaptation circuit 36 typically continues operating thereafter in order to adapt to any changes that occur in the distortion profile of amplifier 22. When the adaptation circuit determines that the optimal coefficients have changed substantially from their previous values, it conveys the new coefficient values to non-linear filter 24. The adaptation circuit may similarly adapt and update the range of powers to be generated by power expander 40 and the weighting coefficients to be applied by linear combiner 44.

Figure 5:
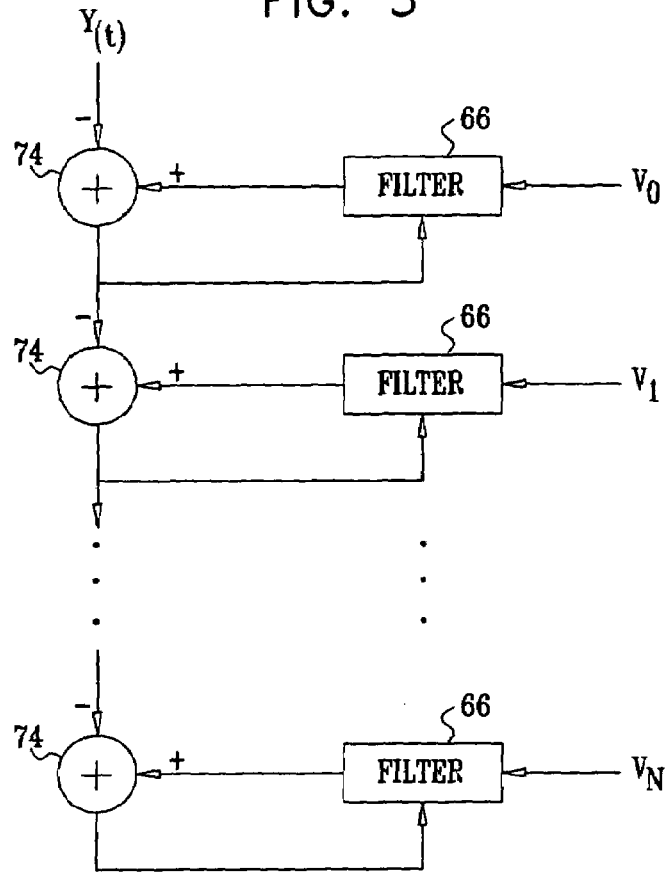
FIG. 5 is a block diagram that schematically shows a detail of an adaptation circuit, in accordance with an alternative embodiment of the present invention.

FIG. 5 is a block diagram showing elements of adaptation circuit 36, in accordance with an alternative embodiment of the present invention. In this case, each filter 66 receives its own error signal from a respective adder 74. The adders are arranged to compute successive differences between the intermediate signal Y(t) and the outputs of the filters. Thus, the error signal to the lowest-order filter (which processes $V_0$) is the difference between the filter output and the intermediate signal Y(t) from non-linear filter 24. The error signal to the next filter (which processes $V_1$) is the difference between the output of this filter and the error signal to the preceding filter, and so on down the line. This embodiment takes advantage of the de-correlation of signal elements $V_0$, $V_1, V_2, \ldots, V_N$, which renders these elements substantially uncorrelated.

Figure 6:
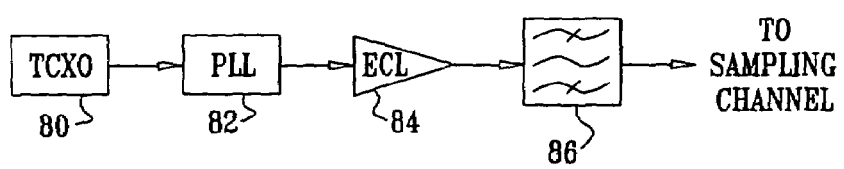
FIG. 6 is a block diagram that schematically illustrates a calibrator circuit for use in calibrating a receiver, in accordance with an embodiment of the present invention.

FIG. 6 is a block diagram that schematically shows details of calibrator 38, in accordance with an embodiment of the present invention. Calibrator 38 comprises a crystal oscillator (TCXO) 80, which generates a output to a frequency synthesizer 82. In the present embodiment, synthesizer 82 comprises a phase-locked loop (PLL), which generates a pure tone of a desired frequency in the operating range of amplifier 22. The synthesizer is typically operated at a number of different frequencies during the calibration procedure in order to generate a calibration curve for the sampling channel as a function of the frequency. Alternatively, synthesizer 82 may be configured to generate a pseudo-noise (PN) sequence, typically at a rate of about one-third the center frequency of the amplifier, in order to generate a spectrum of multiple tones simultaneously, with known phases and amplitudes.

The frequency signal generated by synthesizer 82 is input to a fast digital logic driver 84, typically comprising a high-speed ECL (emitter-coupled logic) buffer with temperature compensation. Driver 84 outputs a square wave at the input frequency with short rise and fall times and very stable amplitude. For example, the 100EP16 driver made by ON Semiconductor Corp. (Phoenix, Ariz.) is capable of generating a square wave at 2.1 GHz with amplitude stability <0.1 dB within its specified range of operating temperatures. Alternatively, for higher frequencies, a SiGe device, such as the ON Semiconductor NBSG16 driver, may be used.

The output of driver 84 is filtered by a bandpass filter 86, in order to pass the fundamental frequency and eliminate the harmonics from the square wave. (Alternatively, the filter may be configured to pass the third harmonic, for example, and eliminate the fundamental frequency and higher harmonics.) A printed circuit filter, formed by conducting traces printed on a substrate, as is known in the art, has been found to give good results for this purpose, and is relatively insensitive to temperature variations. Typically, for a center frequency of 2.1 GHz, a filter bandwidth of about 200 MHz has been found to give good results. Variations in the filter response over the operating band of amplifier 22 may be measured in advance, and then applied in calculating the calibration curve of the sampling channel.

Calibrator 38 thus gives a very stable calibration signal, of known amplitude and frequency, using inexpensive, off-shelf digital components. The accurate calibration of the sampling channel that can be achieved using this calibrator is particularly important in precisely setting channel compensator 59, to ensure that adaptation circuit 36 and non-linear filter 24 provide the desired level of linearity correction. Furthermore, this sort of calibrator may also be used to good effect in calibrating sampling channels and receivers of other types.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. Apparatus for amplifying an input signal having an input signal power, comprising:
    a power amplifier, which is adapted to amplify an intermediate signal so as to generate an output signal, and which is characterized by a non-linearity; and
    a non-linear filter, which is coupled to decompose the input signal into a series of input signal components, each such component proportional to a product of the input signal by a respective integer power of the input signal power, wherein the non-linear filter is adapted to filter the input signal components responsively to the non-linearity so as to generate the intermediate signal for input to the power amplifier.

2. The apparatus according to claim 1, wherein the non-linear filter is adapted to combine the input signal components so as to generate substantially uncorrelated input signal elements, and to filter each of the substantially uncorrelated input signal elements so as to compensate for the non-linearity.

3. The apparatus according to claim 2, wherein the non-linear filter is adapted to generate the substantially uncorrelated input signal elements by linear combination of the input signal components, using weighting coefficients determined so as to minimize a correlation between the signal elements.

4. The apparatus according to claim 2, and comprising an adaptation circuit, which is arranged to decompose the output signal so as to generate substantially uncorrelated output signal components, and to process the substantially uncorrelated output signal components in order to determine filter coefficients to be applied by the non-linear filter in filtering the substantially uncorrelated input signal elements.

5. The apparatus according to claim 4, wherein the adaptation circuit is arranged to filter the substantially uncorrelated output signal components, and to compare the filtered substantially uncorrelated output signal components to the intermediate signal in order to determine the filter coefficients to be applied by the non-linear filter to each of the substantially uncorrelated input signal components.

6. The apparatus according to claim 5, wherein the adaptation circuit is arranged to compute successive differences between the intermediate signal and the filtered substantially uncorrelated output signal components, in order to determine a respective error signal for use in adaptively computing the filter coefficients to be applied to each of the substantially uncorrelated input signal components.

7. The apparatus according to claim 4, wherein the non-linear filter is adapted to generate the substantially uncorrelated input signal elements by linear combination of the input signal components, and wherein the adaptation circuit is arranged to adaptively determine weighting coefficients to be applied by the non-linear filter in generating the substantially uncorrelated input signal elements and to be applied by the adaptation circuit in generating the substantially uncorrelated output signal elements.

8. The apparatus according to claim 2, wherein the non-linear filter is adapted to sum the filtered substantially uncorrelated input signal elements in order to generate the intermediate signal.

9. The apparatus according to claim 1, and comprising an adaptation circuit, which is coupled to receive and process samples of the output signal so as to produce an inverse model of the non-linearity of the power amplifier, and to determine filter coefficients to be applied by the non-linear filter to the signal components responsively to the inverse model.

10. The apparatus according to claim 9, wherein the adaptation circuit is arranged to filter the samples of the output signal responsively to the inverse model, and is further coupled to compare the intermediate signal to the filtered samples of the output signal in order to determine the filter coefficients.

11. The apparatus according to claim 10, wherein the adaptation circuit is arranged to determine the filter coefficients adaptively using a least mean square (LMS) adaptation process, so as to minimize an error signal based on a comparison of the intermediate signal to the filtered samples of the output signal.

12. The apparatus according to claim 9, wherein the adaptation circuit is further arranged to determine adaptively the input signal components into which the input signal is to be decomposed by the non-linear filter.

13. The apparatus according to claim 9, and comprising a sampling channel, which couples the output of the power amplifier to the adaptation circuit, wherein the adaptation circuit comprises a channel compensator, which is adjustable so as to compensate for distortion introduced in the samples of the output signal by the sampling channel.

14. The apparatus according to claim 13, and comprising a calibrator circuit, which is adapted to inject a calibration signal into the sampling channel, so as to determine the distortion introduced in the samples, for use in adjusting the channel compensator.

15. The apparatus according to claim 14, wherein the calibrator circuit comprises a digital logic driver, which generates a square wave of known amplitude and frequency, and a bandpass filter, which filters the square wave so as to provide the calibration signal.

16. The apparatus according to claim 1, wherein the input signal and the intermediate signal are baseband signals, wherein the apparatus comprises an upconverter for upconverting the intermediate signal to a radio frequency (RF) for input to the power amplifier, and wherein the non-linear filter is adapted to apply a low-pass filtering function to the signal components.

17. A method for amplifying an input signal having an input signal power, using a power amplifier characterized by a non-linearity, the method comprising:
    decomposing the input signal into a series of input signal components, each such component proportional to a product of the input signal by a respective integer power of the input signal power;
    filtering the input signal components responsively to the non-linearity so as to generate an intermediate signal for input to the power amplifier; and
    amplifying the intermediate signal using the power amplifier.

18. The method according to claim 17, wherein filtering the signal components comprises combining the input signal components so as to generate substantially uncorrelated input signal elements, and filtering each of the substantially uncorrelated input signal elements so as to compensate for the non-linearity.

19. The method according to claim 18, wherein combining the input signal components comprises determining weighting coefficients so as to minimize a correlation between the signal elements, and generating the substantially uncorrelated input signal elements by linear combination of the input signal components using the weighting coefficients.

20. The method according to claim 18, wherein filtering each of the substantially uncorrelated input signal elements comprises decomposing an output signal from the power amplifier so as to generate substantially uncorrelated output signal components, and processing the substantially uncorrelated output signal components in order to determine filter coefficients to be applied in filtering the substantially uncorrelated input signal elements.

21. The method according to claim 20, wherein processing the substantially uncorrelated output signal components comprises filtering the substantially uncorrelated output signal components, and comparing the filtered substantially uncorrelated output signal components to the intermediate signal in order to determine the filter coefficients.

22. The method according to claim 21, wherein comparing the filtered substantially uncorrelated output signal components comprises computing successive differences between the intermediate signal and the filtered substantially uncorrelated output signal components, and adaptively computing the filter coefficients to be applied to each of the substantially uncorrelated input signal components using a respective error signal by the successive differences.

23. The method according to claim 20, wherein combining the input signal components comprises generating the substantially uncorrelated input signal elements by linear combination of the input signal components, and wherein decomposing the output signal comprises adaptively determining weighting coefficients to be applied in generating both the substantially uncorrelated input signal elements and the substantially uncorrelated output signal elements.

24. The method according to claim 18, wherein filtering the signal components comprises summing the filtered substantially uncorrelated input signal elements in order to generate the intermediate signal.

25. The method according to claim 17, wherein filtering the signal components comprises sampling and processing an output signal from the power amplifier so as to produce an inverse model of the non-linearity of the power amplifier, and determining filter coefficients to be applied to the signal components responsively to the inverse model.

26. The method according to claim 25, wherein processing the output signal comprises filtering the sampled output signal responsively to the inverse model, and wherein determining the filter coefficients comprises comparing the intermediate signal to the filtered, sampled output signal in order to determine the filter coefficients.

27. The method according to claim 26, wherein determining the filter coefficients comprises computing the filter coefficients adaptively using a least mean square (LMS) adaptation process, so as to minimize an error signal based on a comparison of the intermediate signal to the filtered samples of the output signal.

28. The method according to claim 25, wherein decomposing the input signal comprises adaptively selecting the input signal components into which the input signal is to be decomposed.

29. The method according to claim 25, wherein sampling and processing the output signal comprises receiving samples of the output signal via a sampling channel, calibrating the sampling channel so as to determine a distortion introduced by the sampling channel, and correcting the samples so as to compensate for the distortion introduced by the sampling channel.

30. The method according to claim 29, wherein calibrating the sampling channel comprises injecting a calibration signal into the sampling channel, so as to determine the distortion introduced in the samples, for use in correcting the samples.

31. The method according to claim 30, wherein injecting the calibration signal comprises generating a square wave of known amplitude and frequency using a digital logic driver, and filtering the square wave so as to provide the calibration signal.

32. The method according to claim 17, wherein the input signal and the intermediate signal are baseband signals, wherein amplifying the intermediate signal comprises upconverting the intermediate signal to a radio frequency (RF) for input to the power amplifier, and wherein filtering the signal components comprises applying a low-pass filtering function to the signal components.

* * * * *